(12) United States Patent
Miura

(10) Patent No.: US 8,124,476 B2
(45) Date of Patent: Feb. 28, 2012

(54) SEMICONDUCTOR DEVICE AND METHOD OF MANUFACTURING THE SAME

(75) Inventor: Jirou Miura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 132 days.

(21) Appl. No.: 12/553,388

(22) Filed: Sep. 3, 2009

(65) Prior Publication Data

US 2010/0022031 A1 Jan. 28, 2010

Related U.S. Application Data

(62) Division of application No. 11/338,799, filed on Jan. 25, 2006, now abandoned.

(30) Foreign Application Priority Data

Oct. 21, 2005 (JP) .................................. 2005-307176

(51) Int. Cl.
*H01L 21/8242* (2006.01)

(52) U.S. Cl. ............ 438/253; 438/3; 438/387; 257/295; 257/296

(58) Field of Classification Search ............... 438/3, 253, 438/387, 396; 257/295–296, 306, E21.008
See application file for complete search history.

(56) References Cited

U.S. PATENT DOCUMENTS 6,046,469 A 4/2000 Yamazaki et al.
(Continued)

FOREIGN PATENT DOCUMENTS

CN 1610119 A 4/2005
(Continued)

OTHER PUBLICATIONS

Korean Office Action dated Dec. 14, 2006, Application No. 10-2006-0011084.

(Continued)

*Primary Examiner* — Theresa T Doan
(74) *Attorney, Agent, or Firm* — Westerman, Hattori, Daniels & Adrian, LLP

(57) ABSTRACT

Provided is a semiconductor device, including a silicon substrate, a first insulating film formed on the silicon substrate, a first conductive plug formed in an inside of a first contact hole of the first insulating film, an underlying conductive film having a flat surface formed on the first conductive plug and in the circumference thereof, a crystalline conductive film formed on the underlying conductive film, and a capacitor in which a lower electrode, a dielectric film made of a ferroelectric material, and an upper electrode are laminated in this order on the crystalline conductive film.

13 Claims, 13 Drawing Sheets

U.S. PATENT DOCUMENTS

| | | | |
|---|---|---|---|
| 6,444,542 B2 * | 9/2002 | Moise et al. | 438/448 |
| 6,455,370 B1 | 9/2002 | Lane | |
| 6,462,931 B1 | 10/2002 | Tang et al. | |
| 6,485,988 B2 | 11/2002 | Ma et al. | |
| 6,797,561 B2 * | 9/2004 | Ko et al. | 438/240 |
| 6,825,129 B2 | 11/2004 | Hong | |
| 7,045,071 B2 * | 5/2006 | Kweon et al. | 216/13 |
| 2005/0087788 A1 | 4/2005 | Kutsunai et al. | |

FOREIGN PATENT DOCUMENTS

| | | |
|---|---|---|
| JP | 7-22578 A | 1/1995 |
| JP | 10-340871 A | 12/1998 |
| JP | 11-204754 A | 7/1999 |
| JP | 11-330411 A | 11/1999 |
| JP | 2004-146772 A | 5/2001 |
| KR | 1999-030200 | 4/1999 |
| KR | 2002-0094175 A | 12/2002 |

OTHER PUBLICATIONS

Korean Office Action dated Oct. 31, 2007, issued in corresponding Korean Application No. 10-2007-0088850.

Chinese Office Action dated Mar. 14, 2008, issued in corresponding Chinese Application No. 2006100092085.

Japanese Office Action dated Dec. 14, 2010, issued in corresponding Japanese Patent Application No. 2005-307176.

* cited by examiner point A point B point C point D point E

SEMICONDUCTOR DEVICE AND METHOD OF MANUFACTURING THE SAME

CROSS-REFERENCE TO RELATED APPLICATIONS

This application is a division of U.S. application Ser. No. 11/338,799, filed on Jan. 25, 2006 which is based on and claims priority of Japanese Patent Application No. 2005-307176 filed on Oct. 21, 2005, the entire contents of which are incorporated herein by reference.

BACKGROUND OF THE INVENTION

1. Field of the Invention

The present invention relates to a semiconductor device and a method of manufacturing the same.

2. Description of the Related Art

A flash memory and a ferroelectric memory are well-known as nonvolatile memories capable of storing information even after a power supply is turned off.

In the nonvolatile memories, the flash memory includes a floating gate that is embedded in a gate insulating film of an insulated gate field effect transistor (IGFET), and stores information by accumulating electric charges indicating recording information in this floating gate. However, there is a drawback in that such a flash memory requires a relatively high voltage in order to flow the tunnel current to the gate insulating film at the time of writing and erasing the information.

On the other hand, the ferroelectric memory, which is also referred to as FeRAM (Ferroelectric Random Access Memory), stores information by utilizing a hysteresis characteristic of a ferroelectric film provided in a ferroelectric capacitor. The ferroelectric film causes polarization in response to the voltage applied between upper and lower electrodes of the capacitor, and spontaneous polarization becomes residual even after the voltage is removed. When the polarity of the applied voltage is reversed, the polarity of the spontaneous polarization is also reversed. By bringing the direction of the polarity to correspond to "1" and "0", the information is written in the ferroelectric film. The voltage required for the FeRAM to carry out writing is lower than that for the flash memory to carry out writing. In addition, there is also an advantage in that the FeRAM is capable of writing at a higher rate than the flash memory is.

The FeRAM is classified broadly into two categories of a stack type and planar type based on its structure. In the latter planar type, the planar shape of the capacitor tends to be large since a MOS (metal oxide semiconductor) transistor formed on a semiconductor substrate and the lower electrode of the capacitor are electrically connected via metal interconnects on the upper side of the capacitor.

In contrast, in the stack FeRAM, the lower electrode of the capacitor is formed directly on a conductive plug connected to a source/drain region of the MOS transistor, and the lower electrode and the MOS transistor are electrically connected via the conductive plug. With this structure, it is possible to make the planar shape of the capacitor smaller compared with the planar FeRAM so that the minimization of FeRAM required for future is brought about.

It is required for the capacitor dielectric film provided with the stack FeRAM that crystallinity be not deteriorated and an excellent ferroelectric property be provided even when the FeRAM is minimized.

It should be noted that the related technologies are disclosed in Japanese published unexamined applications No. 2004-146772, No. Hei 11-330411, Hei 10-340871, and Hei 7-22578.

SUMMARY OF THE INVENTION

According to one aspect of the present invention, there is provided a semiconductor device, comprising: a semiconductor substrate; an impurity diffusion region formed in a surface layer of the semiconductor device; an insulating film formed on the semiconductor substrate and provided with a hole above the impurity diffusion region; a conductive plug formed in the hole, and electrically connected to the impurity diffusion region; an underlying conductive film formed on the conductive plug and the insulating film around the conductive plug and having a flat surface; a crystalline conductive film formed on the underlying conductive film; and a capacitor formed by laminating a lower electrode, a capacitor dielectric film made of a ferroelectric material, and an upper electrode in this order on the crystalline conductive film.

According to another aspect of the present invention, there is provided a method of manufacturing a semiconductor device, comprising the steps of: forming an impurity diffusion region in a surface layer of a semiconductor substrate; forming an insulating film on the semiconductor substrate; forming a hole in the insulating film above the impurity diffusion region; forming a conductive film for plug on an upper surface of the insulating film and in the hole; leaving the conductive film for plug only in the hole by polishing, and making the conductive film for plug in the hole into a conductive plug which is electrically connected to the impurity diffusion region; forming an underlying conductive film on each of the upper surfaces of the insulating film and the conductive plug; polishing an upper surface of the underlying conductive film to planarize the upper surface; forming a crystalline conductive film on the underlying conductive film; and forming a capacitor in which a lower electrode, a capacitor dielectric film made of a ferroelectric material, and an upper electrode are laminated in this order on the crystalline conductive film.

According to the present invention, at the time of forming the conductive plug in the hole by polishing the conductive film for plug, it is possible that, even when recess is generated in the insulating film in the periphery of the hole by excessive polishing, disorder of crystallinity of the lower electrode resulted from the recess is prevented, since the underlying conductive film formed on this insulating film is polished to planarize the upper surface thereof.

Moreover, even when the crystals of the underlying conductive film is deformed by polishing the underlying conductive film, since a crystalline metal film is formed, it becomes difficult that the above deformation affects the lower electrode, and the action of the crystalline metal film can satisfactorily keep the orientation of the lower electrode thereon.

With this, in the present invention, the crystallinity of the capacitor dielectric film can be improved by the action of the lower electrode having satisfactory crystallinity, and it becomes possible that the ferroelectric property of the capacitor dielectric film, the residual amount of polarization electric charges for example, is improved.

In addition, the deformation of crystals caused in the underlying conductive film resulted from the planarization may be dissolved by exposing an upper surface of the underlying conductive film to nitrogen-containing plasma after the upper surface of the underlying conductive film is planarized.

Further, the crystallinity of the crystalline conductive film may be further improved by exposing the upper surface of the crystalline conductive film to nitrogen-containing plasma.

It should be noted that when a titanium film nitrided in the nitrogen-containing atmosphere is used as the crystalline conductive film, the crystallinity of the crystalline conductive film can be kept without carrying out the above two types of plasma processing.

Further, an oxygen barrier metal may be formed on the crystalline conductive film and the capacitor may be formed thereon. Although various types of annealing particularly required for FeRAM, recovery annealing in an oxygen-containing atmosphere for example, are carried out for the ferroelectric film constituting the capacitor, oxygen is prevented from reaching the conductive plug by the above-described oxygen barrier metal film. Therefore, the generation of contact failure caused by the oxidation of the conductive plug can be suppressed.

When such an oxygen barrier metal film is formed, it is preferable that after the above-described annealing is carried out, portions of oxygen barrier metal film, the crystalline conductive film, and the underlying conductive film which are not covered with the capacitor be subjected to etching back so that these films are left in an island shapes under the capacitor.

DETAILED DESCRIPTION OF THE PREFERRED EMBODIMENT

Detailed descriptions of an embodiment of the present invention will be given by referring to the accompanying drawings.

(1) Preliminary Explanation

Before explaining the present embodiment, a preliminary explanation of the present invention will be given.

FIGS. 1A to 1F are cross-sectional views showing a virtual semiconductor device in process of manufacturing. This semiconductor device is a stack type FeRAM, which is formed as follows.

Figure 1A:
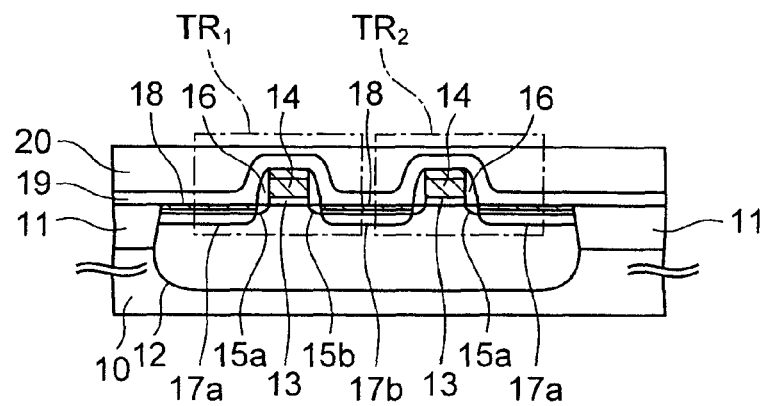
FIGS. 1A to 1F are cross-sectional views showing a virtual semiconductor device in process of manufacturing.

First, steps required until the cross-sectional structure as shown in FIG. 1A is obtained will be described below.

First, on an upper surface of an n-type or a p-type silicon (semiconductor) substrate 10, grooves for STI (Shallow Trench Isolation) defining an active region of a transistor is formed, and an insulating film such as silicon oxide is embedded therein, and the insulating film is used as an device isolation insulating film 11. It should be noted that the device isolation structure is not limited to the STI, but the device isolation film may be also formed by the LOCOS (Local Oxidation of Silicon) method.

Next, a p-well 12 is formed by introducing a p-type impurity into the active region of the silicon substrate 10, a thermal oxidation film to be a gate insulating film 13 is formed by thermally oxidizing the surface of the active region of the silicon substrate 10.

Next, an amorphous or a polycrystalline silicon film is formed on an entire upper surface of the silicon substrate 10, and the silicon film is subjected to patterning by photolithography to form two gate electrodes 14.

The two gate electrodes 14 are arranged at spaced intervals and parallel to each other on the p-well 12, and these gate electrodes 14 constitute a part of a ward line.

Next, an n-type impurity is introduced into the silicon substrate 10 next to the gate electrodes 14 by ion implantation while using the gate electrodes 14 as a mask, and first and second source/drain extensions 15a and 15b are formed.

Then, an insulating film is formed on an entire upper surface of the silicon substrate 10 and insulating sidewalls 16 are formed next to the gate electrodes 14 by etching back the insulating film. As the insulating film, for example, a silicon oxide film is formed by the CVD method.

Next, by carrying out again the ion implantation of the n-type impurity into the silicon substrate 10 while using the insulating sidewalls 16 and the gate electrodes 14 as a mask, first and second source/drain regions 17a and 17b (impurity diffusion region) are formed in the surface layer of the silicon substrate 10 beside the two gate electrodes 14.

By the steps described above, in the active region of the silicon substrate 10, there are formed first and second MOS transistors $TR_1$ and $TR_2$ constructed from the gate insulating film 13, the gate electrodes 14, and the first and second source/drain regions 17a and 17b.

Next, a refractory metal layer such as a cobalt layer is formed on the entire upper surface of the silicon substrate 10 by the sputtering method, and then the refractory metal layer is heated to react with silicon so as to form a refractory metal silicide layer 18 on the silicon substrate 10. This refractory metal silicide layer 18 is also formed on the surface portions of the gate electrodes 14, thereby resistance of the gate electrodes 14 becomes low.

After that, the refractory metal layer which remains unreacted on the device isolation insulating film 11, or the like, is removed by wet etching.

Next, a silicon nitride (SiN) film having a thickness of approximately 80 nm is formed on the entire upper surface of the silicon substrate 10 by the plasma CVD method, and this silicon nitride film is used as a cover insulating film 19. Next, on this cover insulating film 19, a silicon oxide film having a thickness of approximately 11000 nm is formed as a first insulating film 20 by the plasma CVD method using a TEOS gas. After that, an upper surface of the first insulating film 20 is polished by the CMP (Chemical Mechanical Polishing) method to be planarized. As a result of the CMP, the thickness of the first insulating film 20 becomes approximately 800 nm on the flat surface of the silicon substrate 10.

Figure 1B:
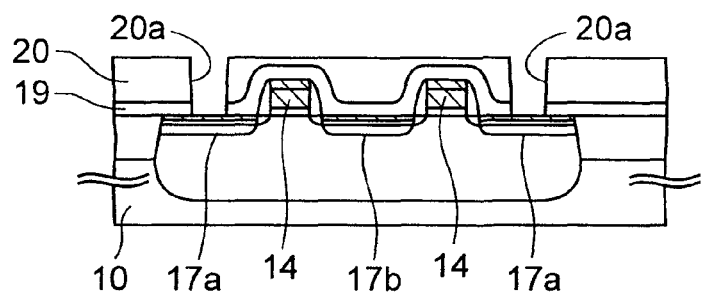

Next, as shown in FIG. 1B, first contact holes 20a are formed over the first source/drain regions 17a by patterning the cover insulating film 19 and the first insulating film 20 by photolithography.

Figure 1C:
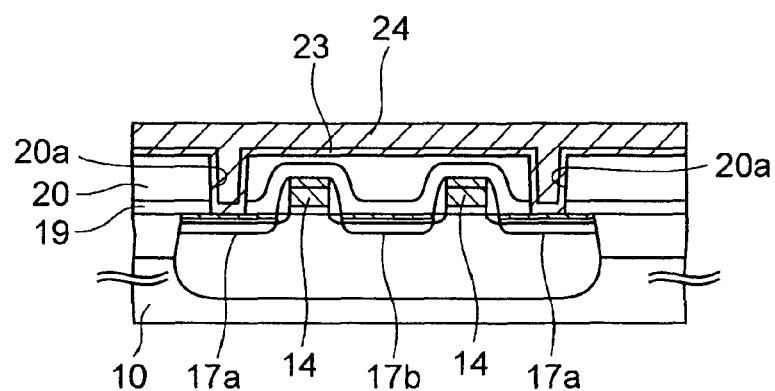

Next, as shown in FIG. 1C, on the upper surface of the first insulating film 20 and the inner surfaces of the holes 20a, a titanium film and a titanium nitride film are formed in this order as a glue film 23 by the sputtering method to have thicknesses of 30 and 20 nm, respectively.

Further, on the glue film 23, a tungsten film is formed as a conductive film 24 for plug by the CVD method using a tungsten hexafluoride gas, and the contact holes 20a are completely embedded by this conductive film 24 for plug. This conductive film 24 for plug has a thickness of approximately 300 nm on the planarized surface of the first insulating film 20.

Figure 1D:
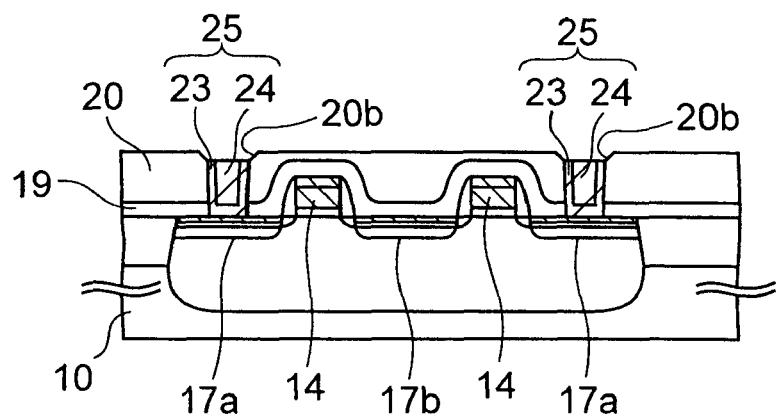

Next, as shown in FIG. 1D, the excessive glue films 23 and conductive films 24 for plug on the first insulating film 20 are removed by polishing with the CMP method. With this, the glue film 23 and the conductive film 24 for plug are left only in the first contact holes 20a as first conductive plugs 25 which are electrically connected to the first source/drain regions 17a.

In this CMP method, a slurry that a polishing speed of the glue film 23 and the conductive film 24 for plug, which are objects of polishing, is faster than that of the underlying first insulating film 20 is used. Such a slurry includes, for example, SSW2000 manufactured by Cabot Microelectronics Corporation. Furthermore, in order not to leave polishing residuals on the first insulating film 20, the polishing thickness is set to be larger than the total thickness of the films 23 and 24, thereby the CMP method becomes over-polishing.

As a result, as illustrated in the figure, a height of the upper surfaces of the first conductive plugs 25 becomes lower than that of the first insulating film 20, and recesses 20b are formed in the first insulating film 20 around the first conductive plugs 25.

Figure 1E:
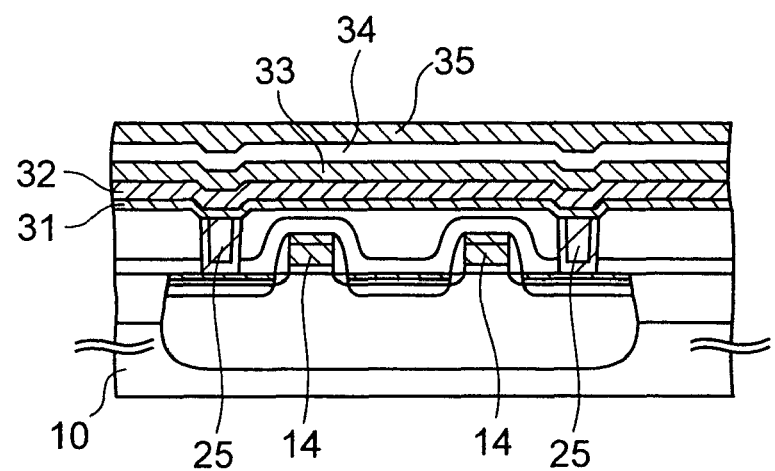

Next, as shown in FIG. 1E, a crystalline conductive film 31 such as a titanium nitride film and an oxygen barrier metal film 32, which prevents the first conductive plugs 25 from being oxidized, are formed in this order by the sputtering method. This oxygen barrier metal film 32 is, for example, a titanium aluminum nitride (TiAlN) film.

Then, a first conductive film 33 such as an iridium film is formed by the sputtering method, and a ferroelectric film 34 such as PZT (Lead Zirconate Titanate: $PbZrTiO_3$) is further formed thereon by the MOCVD (Metal Organic CVD) method, and then, a iridium oxide film is formed as a second conductive film 35 by the sputtering method.

Figure 1F:
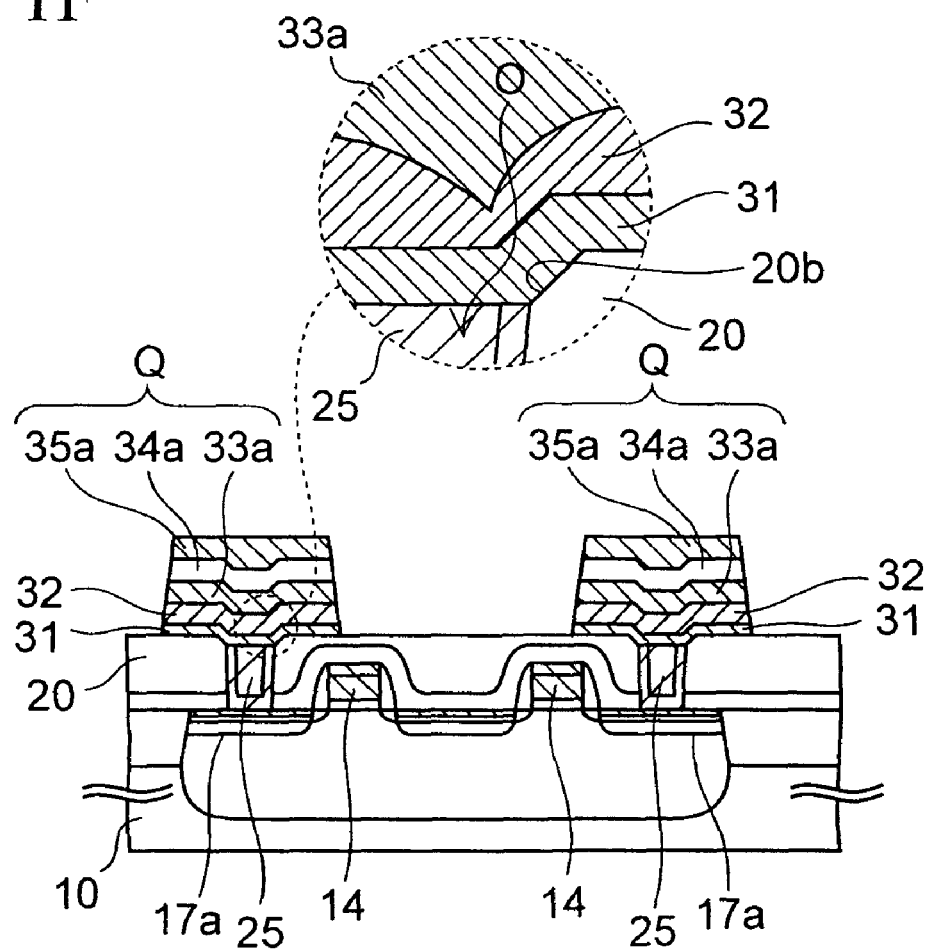

After that, as shown in FIG. 1F, by patterning the second conductive film 35 to the crystalline conductive film 31, there are formed capacitors Q in which lower electrodes 33a, capacitor dielectric films 34a, and upper electrodes 35a are laminated in this order.

By the above steps, a basic structure of the stack FeRAM has been completed.

The FeRAM has a structure in which the lower electrodes 33a of the capacitors Q are electrically connected to the first conductive plugs 25 formed directly thereunder.

In the step of forming the first conductive plugs 25, as described by referring to FIG. 1D, the glue film 23 and the conductive film 24 for plug are subjected to the CMP method so as to be over-polished, thereby a recess 20b is formed in the first insulating film 20 around the contact hole 20a.

However, when such recess 20b is present, the crystallinity of the lower electrode 33a on the recess 20b is disordered, which results in disordering the crystallinity of the capacitor dielectric film 34a. Therefore, the ferroelectric property of the capacitor dielectric film 34a, the residual amount of polarization electric charges for example, becomes decreased.

Such a disorder of crystallinity will be described below by referring to FIG. 2.

Figure 2:
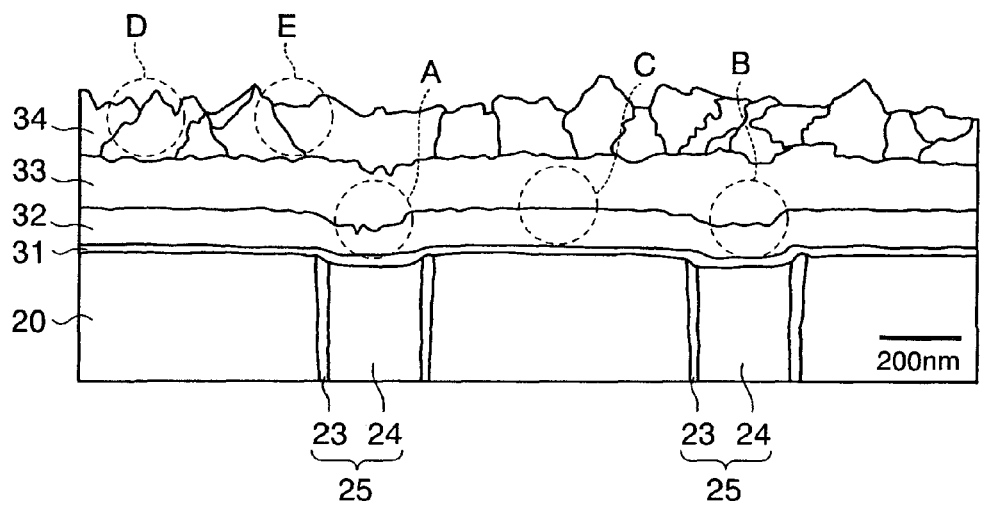
FIG. 2 is a view showing that crystallinity of a film on an insulating film is disordered by recesses formed on the insulating film.
Figure 2:
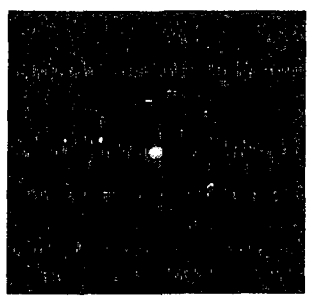
Figure 2:
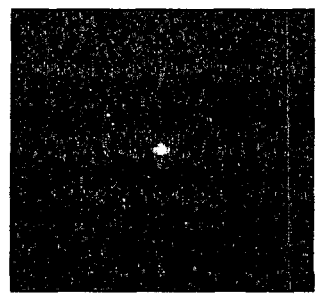
Figure 2:
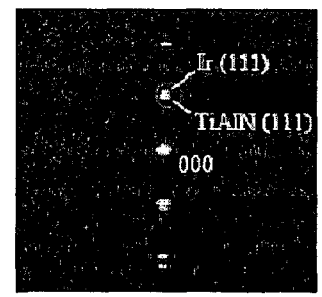
Figure 2:
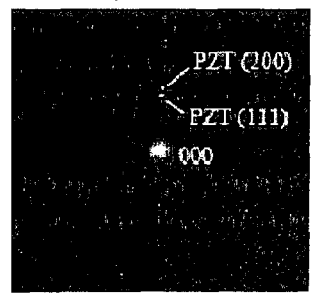
Figure 2:
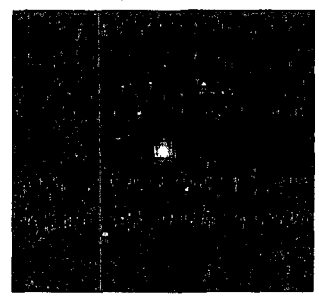

The upper diagram of FIG. 2 is an image obtained in process of manufacturing the above-described semiconductor device by observing the cross-section thereof by the TEM (Transmission Electron Microscopy). In addition, the lower images in FIG. 2 are diffraction images at points A to E of the above cross-section.

As is apparent from the diffraction images of FIG. 2, at point C on the planarized surface of the first insulating film 20, the titanium aluminum nitride film constituting the oxygen barrier metal film 32 is oriented in the (111) direction, and the first conductive film 33 on the oxygen barrier metal film 32 is preferably oriented in the (111) direction.

In contrast, at points A and B above the first conductive plug 25, the diffraction line in the (111) direction of the oxygen barrier metal film 32 and the first conductive film 33 is weak compared with point C, and the diffraction image other than the (111) direction is also observed. Therefore, it is understood that above the first conductive plug 25, the crystallinity of the films 32 and 33 is disordered compared with the other portion.

In addition, focusing on the ferroelectric film 34, at point D apart from the first conductive plug 25, the diffraction lines in the (200) and (111) directions of the PZT constituting the ferroelectric film 34 is clearly observed. Contrary to this, it is understood that at point E closer to the first conductive plug 25, the diffraction line is weak compared with point D, thereby the crystallinity of the PZT is disordered.

From the result of FIG. 2, it is reinforced that the recess 20b formed in the first insulating film 20 around the first conductive plug 25 causes the deterioration of the crystallinity of the first conductive film 33 and the ferroelectric film 34 thereon.

After the capacitor Q (see, FIG. 1F) is formed, in order to recover the damage that the capacitor dielectric films 34a received while being processed, annealing, which is referred to as recovery annealing, is carried out for the capacitor dielectric films 34a in an oxygen-containing atmosphere.

The oxygen barrier metal film 32 protects the first conductive plug 25 formed mainly of tungsten, which is easily oxidized, and functions to prevent causing the contact failure due to the oxidation of the first conductive plug 25.

However, as described above, when the recess 20b is formed in the first insulating film 20, depressed portion reflecting the recess 20b is formed in the oxygen barrier metal 32. The oxygen barrier metal film 32 is formed by the sputtering method having a poor step coverage characteristic. Therefore, as shown in a circle shown by the dotted lines, a film thickness in the side surface of the above depressed portion becomes smaller than that of other portions. This results in lowering the oxygen permeation preventing capability of the oxygen barrier metal film 32 at the side surface, thereby it becomes easy that oxygen reaches to the first conductive plug 25 via a passage shown by an arrow in the figure. As a result, the first conductive plug 25 is oxidized to cause contact failure, thereby the yielding of the semiconductor device is deteriorated.

In view of the forgoing problems, the present inventor has been conceived of the following embodiment of the present invention.

(2) Embodiment of the Present Invention

Figure 3A:
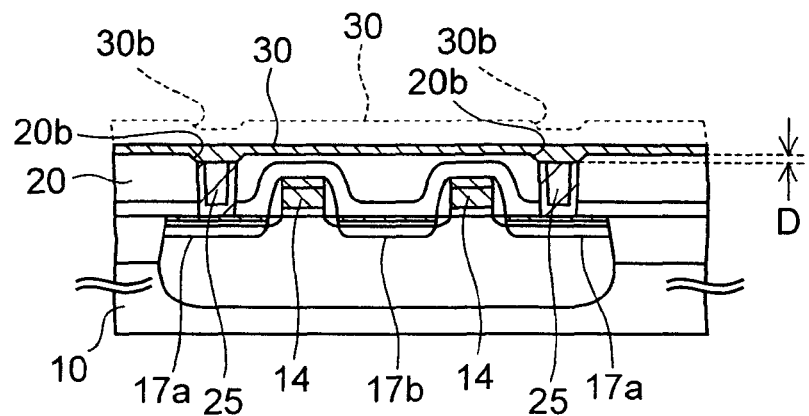
FIGS. 3A to 3N are cross-sectional views showing a semiconductor device according to the present invention in process of manufacturing.
Figure 3B:
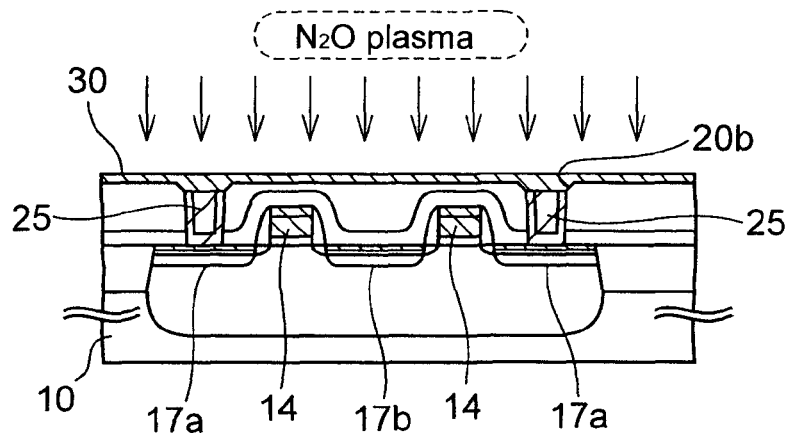
Figure 3C:
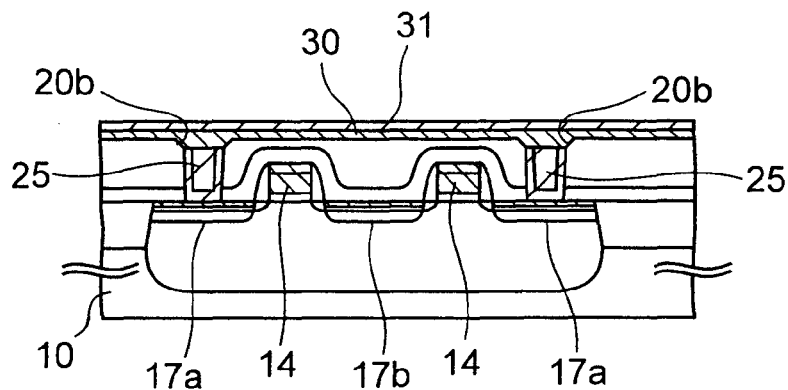
Figure 3D:
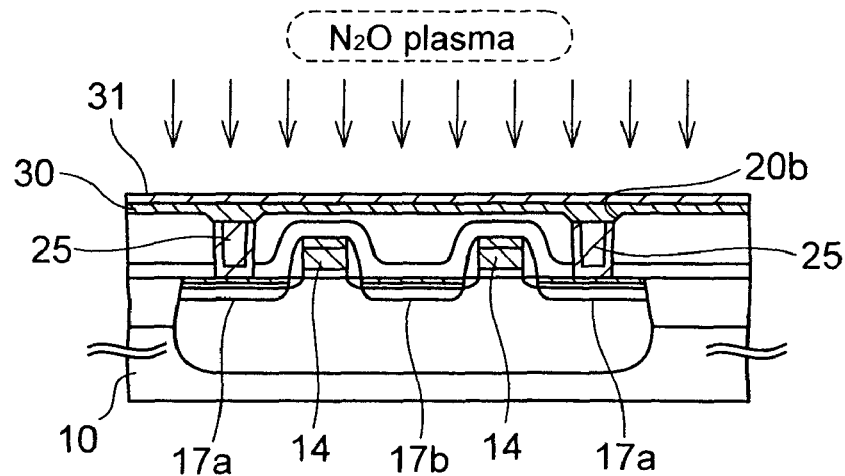
Figure 3E:
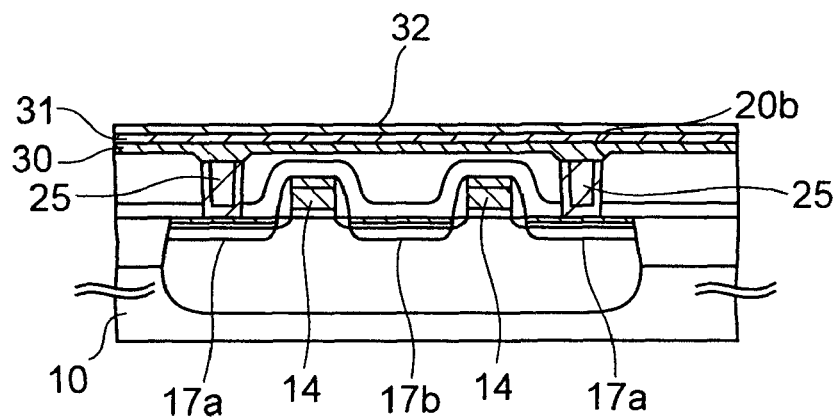
Figure 3F:
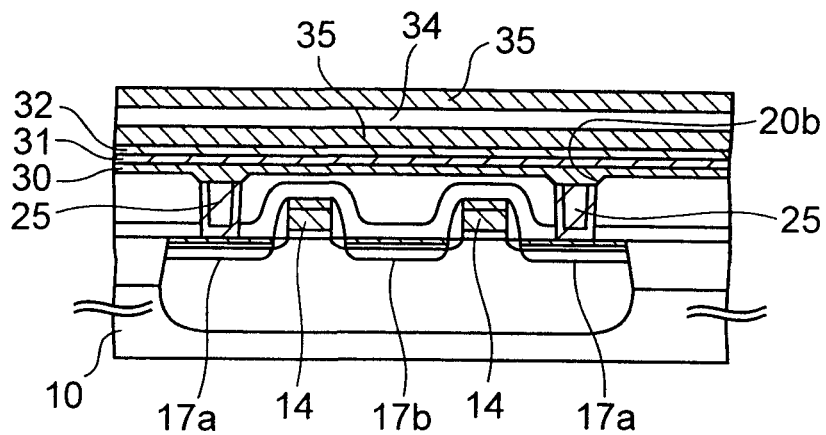
Figure 3G:
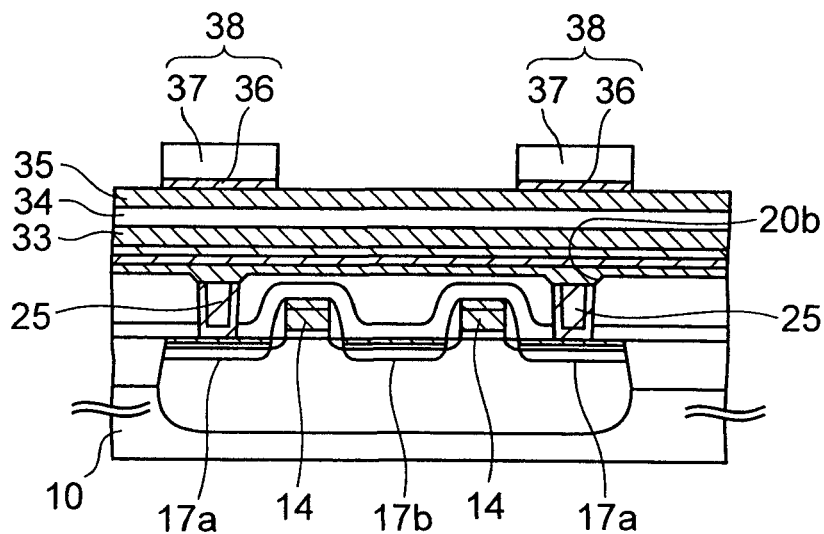
Figure 3H:
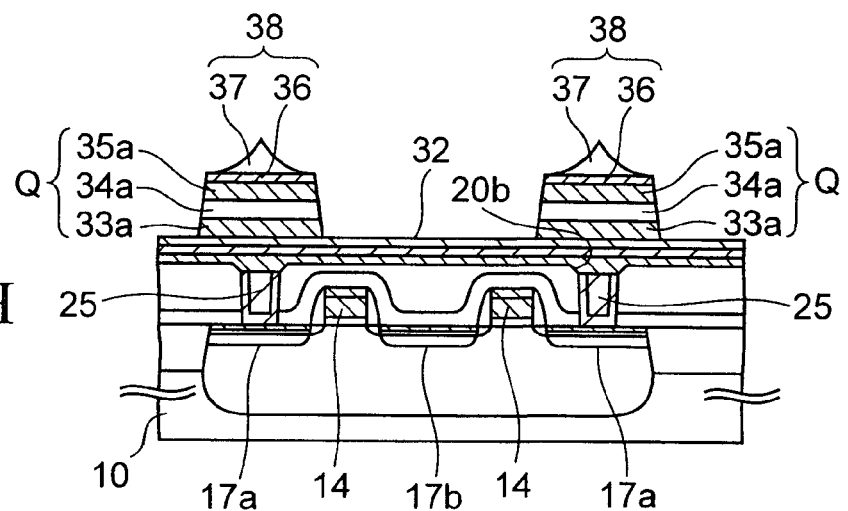
Figure 3I:
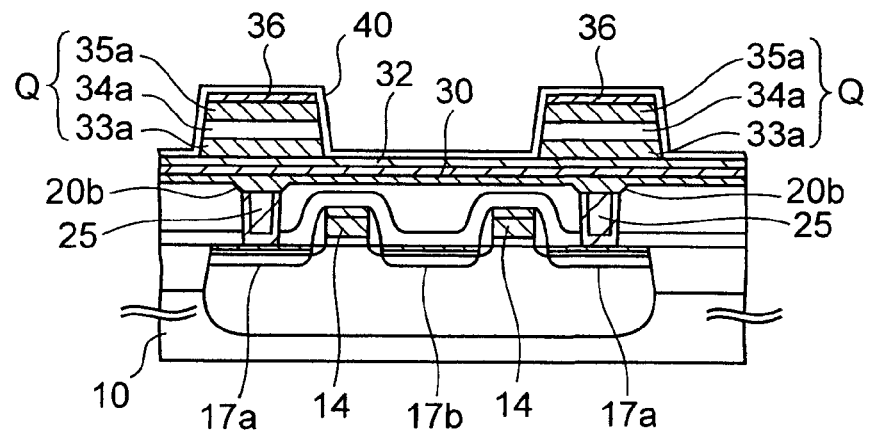
Figure 3J:
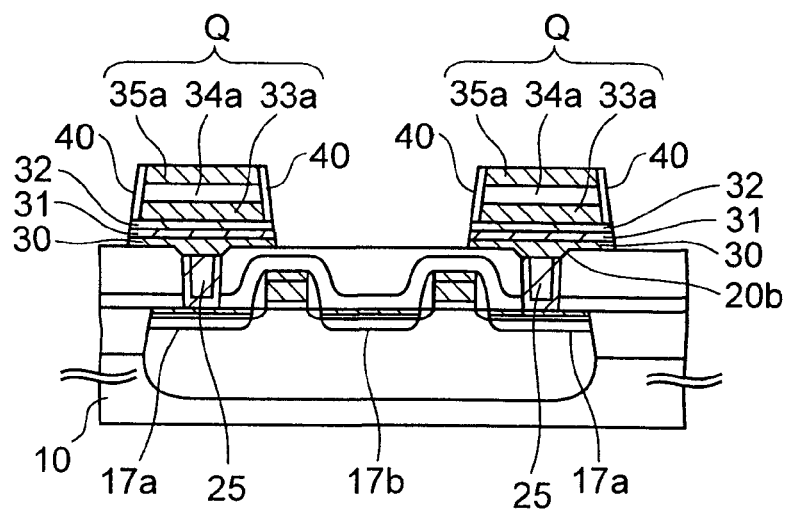
Figure 3K:
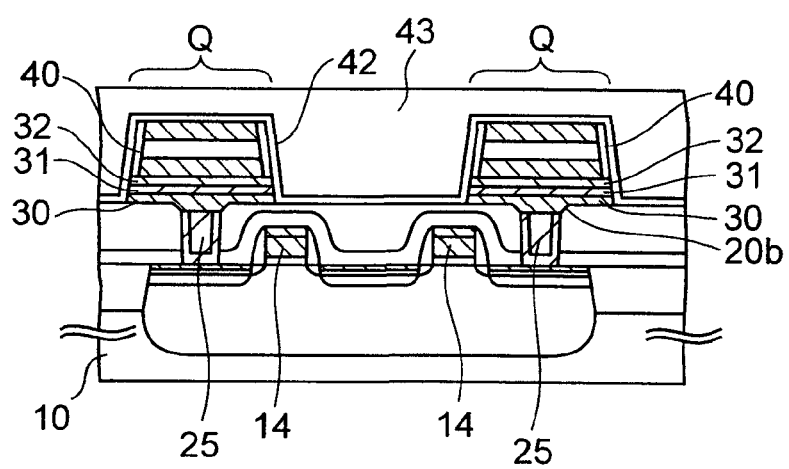
Figure 3L:
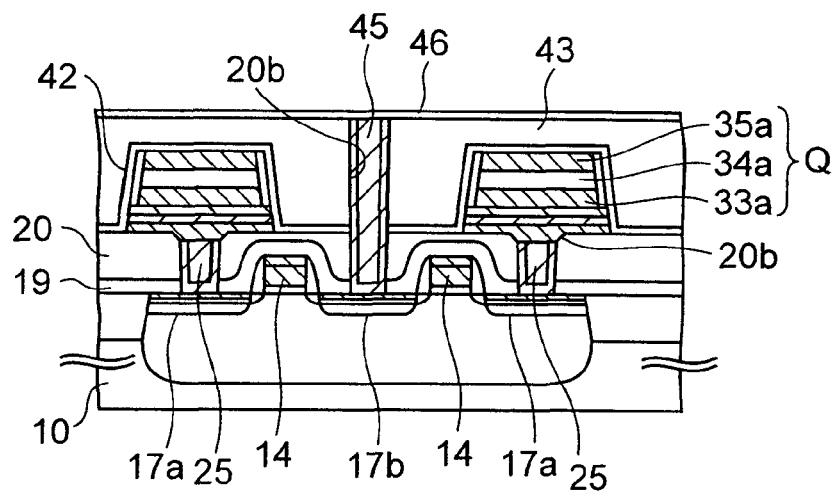
Figure 3M:
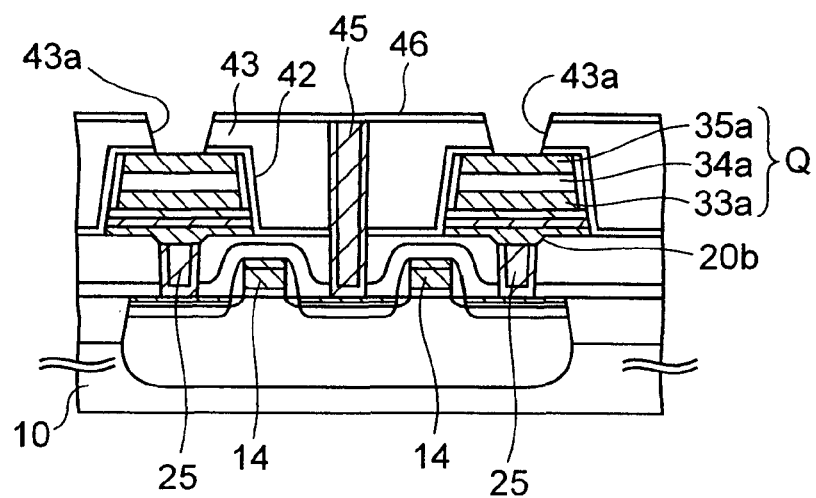
Figure 3N:
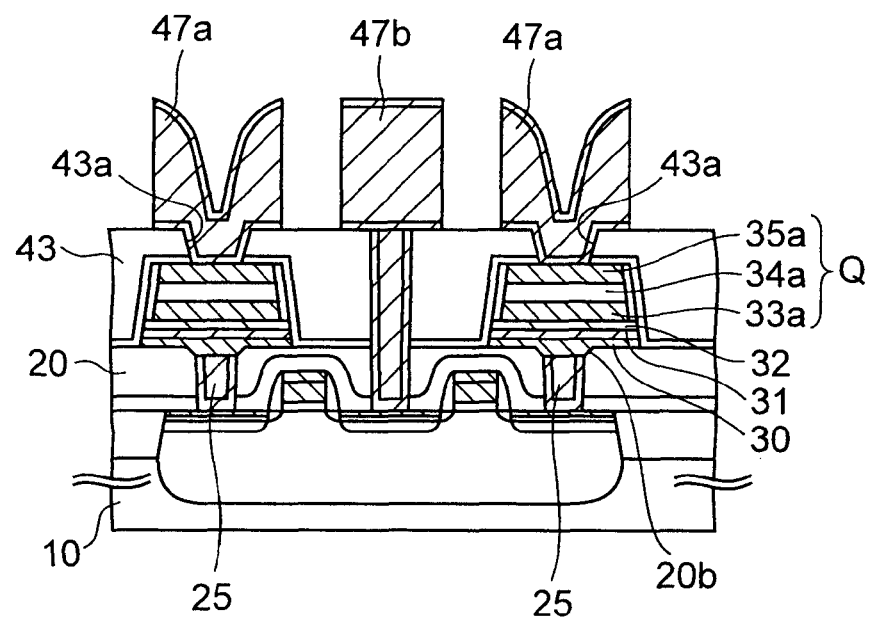

FIGS. 3A to 3N are cross-sectional views showing a semiconductor device according to the present invention in process of manufacturing.

To manufacture a semiconductor device, steps shown in FIGS. 1A to 1D are firstly carried out. Next, as shown in FIG. 3A, a titanium nitride film is formed on each of upper surfaces of a first insulating film 20 and first conductive plugs 25 as an underlying conductive film 30 by the sputtering method, and recesses 20b are embedded by the underlying conductive film 30. In order to make it possible to perform this embedding, in the present invention, the underlying conductive film 30 is formed to have a larger thickness than a depth D of the recess 20b. Typically, the depth D of the recess 20b is approximately 50 nm, and the thickness of the underlying conductive film 30 is set to be from 100 to 300 nm, for example approximately 100 nm.

In addition, the underlying conductive film 30 is not limited to the titanium nitride film, and it may be formed by any one of a tungsten film, a silicon film, and a copper film.

As described above, reflecting the recesses 20b formed in the first insulating film 20 around the first conductive plugs 25, depressed portions 30b are formed on the upper surface of the underlying conductive film 30. However, when such depressed portions 30b are formed, as explained by referring to FIG. 2, there is a possibility that the crystallinity of the ferroelectric film to be formed afterward above the underlying conductive film 30 is deteriorated.

Therefore, in the present embodiment, the upper surface of the underlying conductive film 30 is polished to be planarized by the CMP method so that the depressed portions 30b are removed. Slurry used for this CMP method is not particularly limited, but SSW2000 manufactured by Cabot Microelectronics Corporation is used in the present embodiment.

A thickness of the underlying conductive film 30 after the CMP varies within a single silicon substrate, or from the substrate to substrate, due to a polishing error. Considering such variation, in the present embodiment, a target thickness of the underlying conductive film 30 after the CMP is set to be from 50 to 100 nm, more preferably 50 nm.

As described above, after the CMP is carried out for the underlying conductive film 30, the crystals in the vicinity of the upper surface of the underlying conductive film 30 are distorted by polishing. However, when a lower electrode of the capacitor is formed above the underlying conductive film 30 in which such deformation of the crystals is generated, the lower electrode is affected by such deformation, thereby the deterioration of the crystallinity of the lower electrode is caused. As a result, it is caused that the ferroelectric property of the ferroelectric film thereon is deteriorated.

To avoid such inconvenience, in the next step, as shown in FIG. 3B, the deformation of the crystals of the underlying conductive film 30 is prevented from affecting the film thereon by exposing the upper surface of the underlying conductive film 30 to nitrogen-containing plasma, for example $N_2O$ plasma.

The conditions of this $N_2O$ plasma processing are not particularly limited, but in the present embodiment, pressure in the plasma processing chamber, a substrate temperature, a flow rate of a $N_2O$ gas, and a flow rate of a $N_2$ gas are respectively set to be 3.0 Torr, 350□Ž, 700 sccm, and 200 sccm, and high frequency power of 300 W having a frequency of 13.56 MHz is applied to the atmosphere in the chamber. In addition, processing time is approximately 4 minutes.

Next, as shown in FIG. 3C, on the underlying conductive film 30 in which the deformation of the crystals are dissolved by the above-described $N_2O$ plasma processing, a titanium nitride film having a thickness of approximately 20 nm is formed as a crystalline conductive film 31 by the sputtering method.

The crystalline conductive film 31 has function to increase the orientation of a film to be formed afterward thereon by the action of its orientation, as well as the function of an adhesion film.

The deposition method of this crystalline conductive film 31 is not limited to the above-described sputtering method.

For example, a titanium film formed by the sputtering method may be subjected to annealing in a nitrogen-containing atmosphere, and this nitrided titanium film may be used as the crystalline conductive film 31. This annealing is RTA (Rapid Thermal Anneal) under the conditions of, for example, a substrate temperature of 675□Ž and processing time of 60 seconds. It should be noted that when the titanium film nitrided by annealing is formed as the crystalline conductive film 31, the $N_2O$ plasma processing described in FIG. 3B may be omitted.

Next, as shown in FIG. 3D, the crystallinity of the crystalline conductive film 31 is further improved by exposing the upper surface of the crystalline conducive film 31 to nitrogen-containing plasma, for example, $N_2O$ plasma. Since the conditions of this $N_2O$ plasma processing are the same with the conditions of the $N_2O$ plasma processing for the underlying conductive film 30 as described in FIG. 3B, description thereof is omitted herein.

It should be noted that when the titanium film nitrided by the RTA is used as the crystalline conducive film 31, this $N_2O$ plasma processing may be omitted since the crystallinity of the crystalline conductive film 31 is satisfactory.

Next, as shown in FIG. 3E, a titanium aluminum nitride film having a thickness of approximately 100 nm is formed on the crystalline conductive film 31 by the sputtering method using, as a sputtering gas, a gas mixture containing an argon gas and a nitrogen gas as well as a sputter target made of aluminum, and the titanium aluminum nitride film is used as an oxygen barrier metal film 32.

The oxygen barrier metal film 32 is excellent in preventing the oxygen permeation, and plays a role to suppress the generation of contact failure due to the oxidation of the first conductive plugs 25, which are mainly formed of tungsten easy to be oxidized, by external oxygen. As a film having such a function, in addition to the above-described titanium aluminum nitride film, a titanium nitride film, an iridium film, an iridium oxide film, a platinum film, a ruthenium film, and a SRO ($SrRuO_3$) film can be included, and one of these films may be formed as the oxygen barrier metal film 32.

Next, steps required until the cross-sectional structure shown in FIG. 3F is obtained will be described below.

First, an iridium film having a thickness of approximately 50 to 200 nm is formed on the oxygen barrier metal film 32 as a first conductive film 33 by the sputtering method. It should be noted that in place of the iridium film, any one of a platinum film, a ruthenium film, a rhodium film, a rhenium film, an osmium film, and a palladium film, may be formed as the first conductive film 33.

Next, on the first conductive film 33, a PZT film having a thickness of approximately 120 nm is formed by the MOCVD method, and the PZT film is used as a ferroelectric film 34. In this MOCVD method, $Pb(DPM_2)$, $Zr(dmhd)4$, and $Ti(O-ipr)_2$ $(DPM)_2$ are supplied to the MOCVD chamber as raw materials of Pb, Zr, and Ti at flow rates of 0.32 ml/min., 0.2 ml/min., and 0.2 ml/min., respectively, and a substrate temperature is set to be approximately 580□Ž. In addition, oxygen is introduced to a deposition atmosphere, and partial pressure of oxygen in the atmosphere is set to be approximately 5 Torr.

It should be noted that as deposition methods of the ferroelectric film 34, there are the sputtering method and sol-gel method besides the MOCVD method. When the MOCVD method is used as in the present embodiment, the ferroelectric film 34 is crystallized at the time of deposition. However, when the sputtering method is used, the ferroelectric film 34 is not crystallized at the time of deposition. Therefore, crystallization annealing is carried out in an oxygen atmosphere to crystallize the ferroelectric film 34 when the film 34 is formed by the sputtering method. This crystallization annealing is two-step RTA, which includes, for example, a first step carried out under the conditions of a substrate temperature of 600°Ž in a gas mixture atmosphere containing argon and oxygen and processing time of 90 seconds, and a second step carried out under the conditions of a substrate temperature of 750°Ž in an oxygen atmosphere and processing time of 60 seconds.

Further, the material of the ferroelectric film 34 is not limited to the above PZT, but it may be formed by dielectric materials other than the PZT having a perovskite structure which is represented by a general formula $ABO_3$, for example BLT (Bismuth Lanthanum Titanate: $(Bi, La)_4Ti_3O_{12}$), or Bi layered structure compounds such as $SrBi_2Ta_2O_9$ and $SrBi_2(Ta, Nb)_2O_9$. Furthermore, any one of lanthanum, calcium, strontium, and silicon may be doped into the above-described PZT.

After that, an iridium oxide ($IrO_2$) film having a thickness of approximately 200 nm is formed on the ferroelectric film 34 by the sputtering method, and the iridium oxide film is used as a second conductive film 35. As a film capable of being formed as the second conductive film 35, in addition to the above-described iridium oxide film, a platinum film, a ruthenium film, a rhodium film, a rhenium film, an osmium film, a palladium film, and a SRO film.

As described above, since the upper surface of the underlying conductive film 30 is planarized, flatness of the above-described first conductive film 33, the ferroelectric film 34 and the second conductive film 35 becomes satisfactory.

Next, steps required until the cross-sectional structure shown in FIG. 3G is obtained will be described below.

First, a titanium nitride film is formed on the second conductive film 35 as a first mask material layer 36 by the sputtering method. In addition, a silicon oxide film is further formed thereon by the CVD method using the TEOS gas, and the silicon oxide film is used as a second mask material layer 37.

Next, after patterning the second mask material layer 37 to have an island shape, the first mask material layer 36 is etched by using this second mask material layer 37 as a mask so that hard masks 38 made of the island-shaped first and second mask material layers 37 and 38, are formed.

Next, as shown in FIG. 3H, by using a gas mixture containing HBr, O2, Ar and C4F8 as an etching gas, portions of the first conductive film 33, the ferroelectric film 34, and the second conductive film 35 which are not covered with the hard masks 38, are subjected to dry etching so that capacitors Q constructed from the lower electrode 33a, the capacitor dielectric film 34a, and the upper electrode 35a are formed.

This etching stops on the oxygen barrier metal film 32, and the entire upper surface of the silicon substrate 10 is in a state of being covered with the oxygen barrier metal film 32 even after the etching is finished.

Next, as shown in FIG. 3I, after removing the second mask material layers 37 by dry etching or wet etching, an alumina film having a thickness of 20 to 50 nm is formed on the entire upper surface of the silicon substrate 10 as a first capacitor protect insulating film 40 by the sputtering method. The deposition methods of the first capacitor protect insulating film 40 can include the MOCVD method and an ALD (Atomic Layer Dielectric) method in addition to the sputtering method.

The alumina film constituting the first capacitor protect insulating film 40 has an excellent function to prevent permeation of reductant such as hydrogen and water. Therefore, it plays a role to prevent deterioration of a ferroelectric property caused by reduction of the capacitor dielectric films 34a by the reductant.

It should be noted that annealing may be carried out before the first capacitor protect insulating film 40 is formed in order to prevent peering off of the first capacitor insulating film 40. This annealing is carried out under conditions of, for example, a substrate temperature of 350°Ž and processing time of 1 hour.

The capacitor dielectric films 34a are in shortage of oxygen because of damage received at the times of sputtering and patterning of the capacitors Q. Therefore, the ferroelectric property thereof is deteriorated.

In order to recover the damage that the capacitor dielectric films 34a receive, recovery annealing is carried out in an oxygen-containing atmosphere for the capacitor dielectric film 34a. A condition of this annealing is not particularly limited, but in the present embodiment, it is carried out under the condition of a substrate temperature of 550 to 650=Ž in a furnace.

The oxygen barrier metal film 32 is left on the entire upper surface of the silicon substrate 10 even after the recovery annealing is carried out in the oxygen-containing atmosphere. Therefore, oxygen in an annealing atmosphere is blocked by the oxygen barrier metal film 32, and incapable of reaching to the first contact plugs 25. With this, contact failure caused by oxidation of the first conductive plugs 25 constructed mainly from tungsten which is extremely easy to be oxidized, is prevented, and a yield of manufacturing a semiconductor device is improved.

Moreover, since the underlying conductive film 30 is formed in the present embodiment, the depressed portions caused by the recesses 20b are not formed in the oxygen barrier metal film 32. Therefore, the oxygen barrier metal film 32 with a uniform thickness is formed on the entire upper surface of the silicon substrate 10. Therefore, oxygen is effectively blocked on the entire portion of the oxygen barrier metal film 32, thereby sufficient recovery annealing can be carried out while preventing the oxidation of the first conductive plugs 25.

This oxygen barrier metal film 32 becomes unnecessary after the recovery annealing is finished.

Therefore, in the next step, as shown in FIG. 3J, by carrying out overall etching back from the upper side of the silicon substrate 10, the portions of oxygen barrier metal film 32, the crystalline conductive film 31, and the underlying conductive film 30, which are not covered with the capacitors Q, are removed by the etching so that these films are left in island shapes only under the capacitors Q.

This etching back is carried out under conditions of, for example, supplying a gas mixture containing a $CF_4$ gas and an $O_2$ gas at a flow rate ratio of 5% and 95%, respectively, as an etching gas to a down-flow type of a plasma etching chamber, as well as supplying high frequency power of 1400 W having a frequency of 2.45 GHz to the upper electrode of the chamber. It is also carried out in the condition of a substrate temperature of 200°Ž.

Alternatively, the etching back may be carried out by wet etching using a mixed solution containing $H_2O_2$, $NH_3OH$, and pure water as an etching liquid.

It should be noted that, in this etching back, the first mask material layer 36, which is left on the upper surface of the capacitor Q, is also removed. In addition, the etching back is carried out anisotropically, and the first capacitor protect insulating film 40 is left on the side surface of the capacitor Q.

Therefore, it is prevented that damage caused by the etching enters into the capacitor dielectric film 34a from the side surface of the capacitor Q.

Next, steps required until the cross-sectional structure shown in FIG. 3K is obtained will be described below.

First, on the entire upper surface of the silicon substrate 10, an alumina film having a thickness of approximately 20 to 100 nm is formed as a second capacitor protect insulating film 42 by the sputtering method. It should be noted that in place of the sputtering method, the MOCVD method and ALD method can be used for forming the second capacitor protect insulating film 42.

In addition, to prevent peering off of this second capacitor protect insulating film 42, annealing may be carried out in an oxygen-containing atmosphere before the second capacitor protect insulating film 42 is formed. This annealing is carried out under conditions of, for example, a substrate temperature of 350☐Ž and processing time of 1 hour in a furnace containing oxygen.

Next, a second insulating film 43 is formed on the second capacitor protect insulating film 42 by the HDPCVD (High Density Plasma CVD) method using silane as a reactant gas so that space between adjacent two capacitors Q is embedded by the second insulating film 43. After that, the upper surface of the second insulating film 43 is polished to be planarized by the CMP method. A thickness of the second insulating film 43 after the planarization becomes approximately 2000 nm on the planarized surface of the silicon substrate 10.

Next, steps required until the cross-sectional structure shown in FIG. 3L is obtained will be described below.

First, by patterning from the second insulating film 43 to the cover insulating film 19 by photolithography and etching, a second contact hole 20b is formed on these insulating films on the second source/drain region 17b.

Then, on the inner surface of this second contact hole 20b and the upper surface of the second insulating film 43, a titanium nitride film is formed as a glue film by the sputtering method, and a tungsten film is further formed on the glue film by the CVD method so that the second contact hole 20b is completely embedded by this tungsten film. After that, the excessive glue film and tungsten film on the second insulating film 43 are polished to be removed, and these films are left only in the second contact hole 20b as a second conductive plug 45.

Next, a silicon oxide nitride (SiON) film having a thickness of approximately 100 nm is formed on each of the upper surfaces of this second contact hole 20b and the second insulating film 43 by the CVD method, and this silicon oxide nitride film is set to be an antioxidant insulating film 46.

Next, as shown in FIG. 3M, by patterning the antioxidant insulating film 46, the second insulating film 43, and the second capacitor protect insulating film 42, holes 43a are formed in these films.

After forming the holes 43a, to recover the damage that the capacitor dielectric films 34a received during the forgoing steps, recovery annealing can be carried out in an oxygen-containing atmosphere. At the time of the recovery annealing, the upper surface of the second conductive plug 45 is covered by the antioxidant insulating film 46. Therefore, generation of contact failure caused by oxidation of the second conductive plug 45 can be suppressed.

Next, steps required until the cross-sectional structure shown in FIG. 3N is obtained will be described below.

First, the above-described antioxidant insulating film 46 is etched to be removed.

Next, a metal laminated film is formed on the upper surface of the second insulating film 43 and the inner surfaces of the holes 43a by the sputtering method. The metal laminated film is formed by laminating the films, in the following order, including, for example, a titanium nitride film having a thickness of approximately 50 nm, a copper-containing aluminum film having a thickness of approximately 360 nm, and a titanium nitride film having a thickness of approximately 70 nm.

After that, this metal laminated film is subjected to patterning by photolithography and etching so that first layer metal interconnects 47a which are electrically connected to the upper electrodes 35a are formed, as well as a metal pad 47b for a bit line is formed on the second conductive plug 45.

After that, although the steps proceed to the step of forming a third insulating film on the first layer metal interconnects 47a and the metal pad 47b, detailed descriptions are omitted herein.

Up to these steps, a basic structure of the semiconductor device according to the present embodiment has been completed.

According to the present embodiment described above, as described by referring to FIG. 3A, the underlying insulating film 30 is formed on the first conductive plug 25 and the first insulating film 20, and the upper surface of the underlying conductive film 30 is polished to be planarized by the CMP. Therefore, the depressed portion reflecting the recess 20b generated in the first insulating film 20 around the first conductive plug 25 is not formed on the upper surface of the underlying conductive film 30.

Therefore, as shown in FIG. 3N, since the lower electrode 33a above the underlying insulating film 30 are also formed flat, the crystallinity of the lower electrodes 33a is improved and the orientation of the iridium film constituting the lower electrodes 33a in the (111) direction is intensified. Then, by the action of such a satisfactory orientation of the lower electrode 33a, the capacitor dielectric film 34a on the lower electrode 33a are strongly oriented to its polarization direction of the (111) direction. Therefore, the ferroelectric property of the capacitor dielectric film 34a is improved, thereby writing and retrieving information in and from the capacitors Q become easy.

In the present embodiment, the crystalline conductive film 31 is formed on the underlying conductive film 30 planarized by the CMP, and the lower electrode 33a is formed above the crystalline conductive films 31. In stead of this, it is considered to omit the crystalline conductive film 31 and form the lower electrode 33a on and in contact with the underlying conductive film 30.

However, on the surface of the underlying conductive film 30 subjected to the CMP, the crystals of titanium nitride constituting the underlying conductive film 30 are deformed by the CMP. Therefore, if the lower electrode 33a are formed on and in contact with the underlying conductive film 30, the deformation of the crystals of titanium nitride affects the lower electrodes 33a, and hence the crystallinity of the lower electrodes 33a is also deformed.

Figure 4:
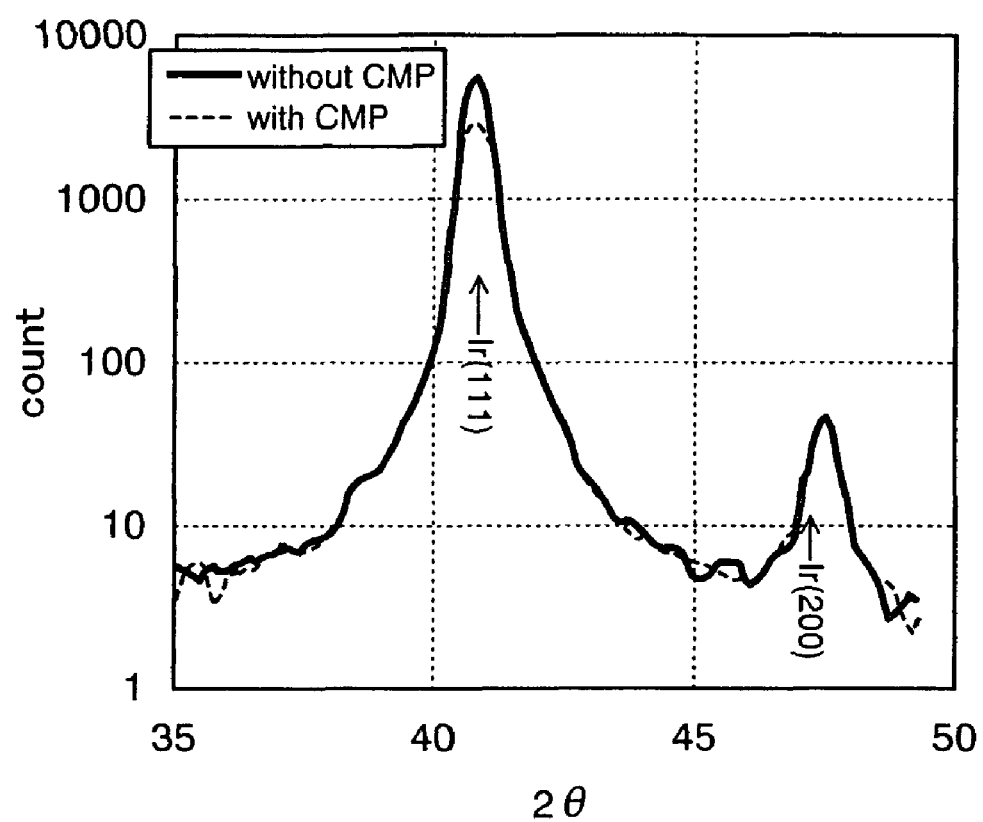
FIG. 4 is a graph showing locking curve indicating intensities of orientation in a (111) direction and a (200) direction of an iridium film formed on a titanium nitride film.
Figure 5:
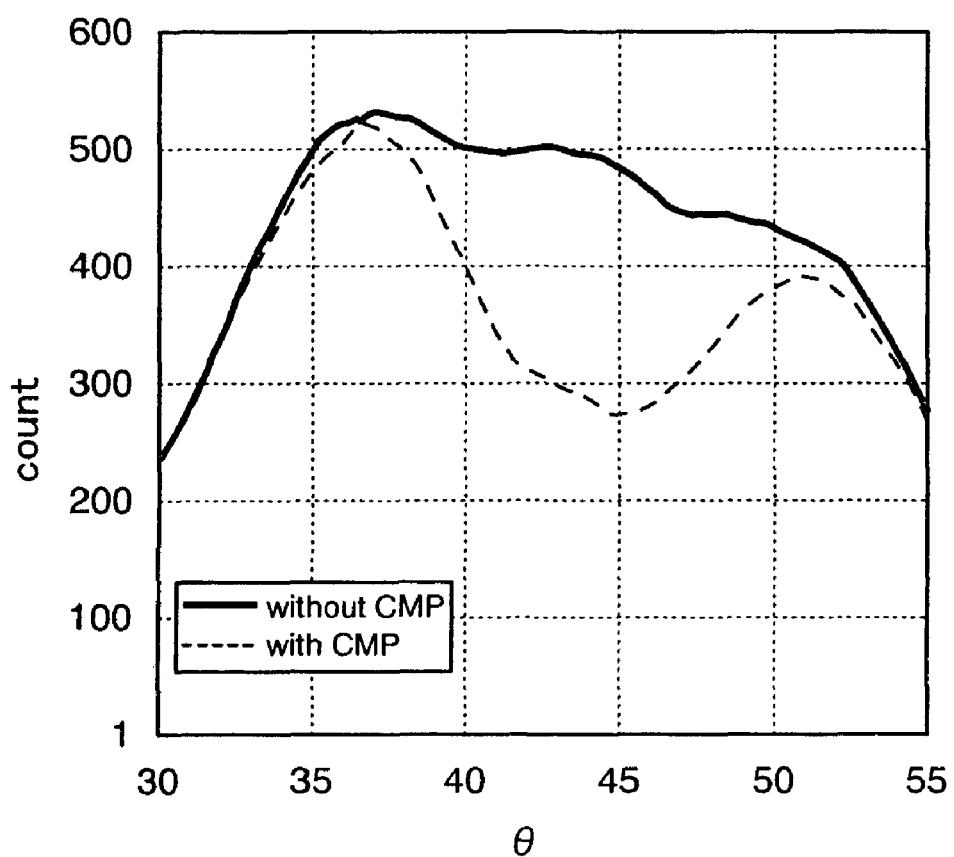
FIG. 5 is a graph showing locking curve indicating a intensity of orientation in a (222) direction of the iridium film formed on the titanium nitride film.

FIGS. 4 and 5 are views showing the result of the experiments conducted by the present inventor in order to confirm this.

In these experiments, intensity of the orientation of iridium was investigated by XRD (X ray Diffraction) analysis in each of the cases where an iridium film was directly formed on a flat titanium nitride film which was not subjected to the CMP and where an iridium film was formed on a titanium nitride film after being subjected to the CMP.

In particular, the results shown in FIG. 4 are obtained by investigating the intensity of the orientation of iridium in the (111) and (200) directions, and the results shown in FIG. 5 are obtained by investigating the intensity of the orientation of iridium in the (222) direction. It should be noted that θ in a horizontal axis of these graphs shows a diffraction direction of X-ray and a vertical axis shows the number of count of the X-ray.

As is apparent from FIG. 4, when the CMP is carried out, the intensity of the orientation in the (111) direction of iridium decreases compared with the case where the CMP is not carried out.

In addition, FIG. 5 reveals that substantially only a single of peak is appeared in the rocking curve when the CMP is not carried out, and this indicates that the iridium is preferably oriented in the (222) direction. In contrast, when the CMP is carried out, it can be understood that two peaks of rocking curve are observed, which shows that a plurality of orientations coexists in iridium and the crystallinity of iridium is disordered.

From these results, it becomes apparent that when an iridium film is formed on a titanium nitride film on which the CMP is carried out, the orientation of the iridium film is disordered.

In a view of the above point, in the present embodiment, the crystalline conductive films 31 are formed on the underlying conductive film 30 to which the CMP was carried out as described above, and the lower electrode 33a is formed on the underlying conductive film 30. Therefore, the disorder of crystallinity of the underlying conductive film 30 resulted from the CMP does not affect the lower electrodes 33a, and hence the crystallinity of the lower electrode 33a is improved.

Moreover, since the $N_2O$ processing is carried out before and after the above crystalline conductive films 31 are formed, the crystallinity of the crystalline conductive films 31 becomes satisfactory. Therefore, it becomes possible that the crystallinity of the lower electrodes 33a can be further improved by the action of the crystalline conductive films 31.

In addition, in the present embodiment, tungsten, which has been widely used in logic semiconductor devices or the like, is used as a constituent material of the first conductive plug 25, and there is no need to change the material. Therefore, the first conductive plug 25 can be designed by utilizing the design property of semiconductor devices that has been accumulated, thereby making it possible to reduce manpower and cost required for newly designing the first conductive plugs 25.

As described above, according to the present invention, the underlying conductive film is planarized, and hence the crystallinity of the lower electrode formed thereon can be improved. Further, even when the deformation of crystals of the underlying conductive film is caused by the planarization, the deformation affecting the lower electrodes is prevented by the crystalline conductive film, as well as the crystallinity of the lower electrode becomes satisfactory by the action of the crystalline conductive film. As a result, the crystallinity of the capacitor dielectric film formed on the lower electrode is also improved, thereby the ferroelectric property thereof can be improved.

What is claimed is:

1. A method of manufacturing a semiconductor device, comprising the steps of:
    forming an impurity diffusion region in a surface layer of a semiconductor substrate;
    forming an insulating film on the semiconductor substrate;
    forming a hole in the insulating film above the impurity diffusion region;
    forming a conductive film for plug on an upper surface of the insulating film and in the hole;
    leaving the conductive film for plug only in the hole by polishing, and making the conductive film for plug in the hole into a conductive plug which is electrically connected to the impurity diffusion region;
    forming an underlying conductive film on each of the upper surfaces of the insulating film and the conductive plug;
    polishing an upper surface of the underlying conductive film to planarize the upper surface;
    forming a crystalline conductive film on the planarized upper surface of the underlying conductive film; and
    forming a capacitor in which a lower electrode, a capacitor dielectric film made of a ferroelectric material, and an upper electrode are laminated in this order on the crystalline conductive film.

2. The method of manufacturing a semiconductor device according to claim 1, wherein, after planarizing the upper surface of the underlying conductive film, a step of exposing the upper surface of the underlying conductive film to nitrogen-containing plasma is carried out, or a step of exposing the upper surface of the crystalline conductive film to nitrogen-containing plasma is carried out.

3. The method of manufacturing a semiconductor device according to claim 2, wherein the nitrogen-containing plasma is $N_2O$ plasma.

4. The method of manufacturing a semiconductor device according to claim 1, wherein the step of forming the crystalline conductive film includes steps of forming a titanium film on the underlying conductive film, and heating the titanium film in a nitrogen-containing atmosphere to nitride the titanium film.

5. The method of manufacturing a semiconductor device according to claim 4, further comprising a step of forming an oxide barrier metal film on the crystalline conductive film after the crystalline conductive film is formed, wherein the capacitor is formed on the oxygen barrier metal film in the step of forming the capacitor.

6. The method of manufacturing a semiconductor device according to claim 5, further comprising a step of carrying out annealing in an oxygen-containing atmosphere for the capacitor dielectric film after the capacitor is formed.

7. The method of manufacturing a semiconductor device according to claim 6, further comprising a step of etching back portions of the oxygen barrier metal film, the crystalline conductive film, and the underlying conductive film to leave these films under the capacitor in island shapes, where the portions being uncovered by the capacitor.

8. The method of manufacturing a semiconductor device according to claim 7, further comprising a step of forming a capacitor protect insulating film on the capacitor and the oxygen barrier metal film after the capacitor is formed, and in the step of etching back the oxygen barrier metal film, the capacitor protect insulating film is also subjected to etching back to leave the capacitor protect insulating film only on a side surface of the capacitor.

9. The method of manufacturing a semiconductor device according to claim 8, wherein an alumina film is formed as the capacitor protect insulating film.

10. The method of manufacturing a semiconductor device according to claim 7, wherein the etching back is carried out by one of dry etching using a gas mixture containing a $CF_4$ gas and an $O_2$ gas, and wet etching using a mixed solution containing $H_2O_2$, $NH_3OH$, and a water as an etching liquid.

11. The method of manufacturing a semiconductor device according to claim 5, wherein the oxygen barrier metal film is any one of a titanium aluminum nitride film, a titanium nitride film, an iridium film, an iridium oxide film, a platinum film, a ruthenium film, and a SRO (SrRuO$_3$) film.

12. The method of manufacturing a semiconductor device according to claim 1, wherein any one of a tungsten film, a silicon film, a titanium nitride film, and a copper film is formed as the underlying conductive film.

13. The method of manufacturing a semiconductor device according to claim 1, wherein a titanium nitride film is formed as the crystalline conductive film.

* * * * *